(12) United States Patent
Liu et al.

(10) Patent No.: US 6,392,922 B1
(45) Date of Patent: May 21, 2002

(54) PASSIVATED MAGNETO-RESISTIVE BIT STRUCTURE AND PASSIVATION METHOD THEREFOR

(75) Inventors: Harry Liu, Plymouth; Lonny Berg, Elk River; William L. Larson, Eden Prairie, all of MN (US); Shaoping Li, Naperville, IL (US); Theodore Zhu, Maple Grove; Joel Drewes, Minnetonka, both of MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/638,419

(22) Filed: Aug. 14, 2000

(51) Int. Cl.$^7$ .......................... H01L 29/82; G11C 11/15
(52) U.S. Cl. ..................... 365/158; 257/421; 365/173
(58) Field of Search ................ 257/306, 295, 257/421; 365/97, 158, 171, 173; 438/3

(56) References Cited

U.S. PATENT DOCUMENTS

| | | |
|---|---|---|
| 3,623,032 A | 11/1971 | Schapira |
| 3,623,035 A | 11/1971 | Kobayashi et al. |
| 3,816,909 A | 6/1974 | Maeda et al. |
| 3,947,831 A | 3/1976 | Kobayashi et al. |
| 4,044,330 A | 8/1977 | Johnson et al. |
| 4,060,794 A | 11/1977 | Feldman et al. |
| 4,158,891 A | 6/1979 | Fisher |
| 4,455,626 A | 6/1984 | Lutes |
| 4,731,757 A | 3/1988 | Daughton et al. |
| 4,780,848 A | 10/1988 | Daughton et al. |
| 4,801,883 A | 1/1989 | Muller et al. |
| 4,849,695 A | 7/1989 | Muller et al. |
| 4,945,397 A | 7/1990 | Schuetz |
| 5,039,655 A | 8/1991 | Pisharody |
| 5,064,499 A | 11/1991 | Fryer |
| 5,140,549 A | 8/1992 | Fryer |
| 5,496,759 A | 3/1996 | Yue et al. |
| 5,547,599 A | 8/1996 | Wolfrey et al. |
| 5,569,617 A * | 10/1996 | Yeh et al. .................. 438/3 |
| 5,587,943 A | 12/1996 | Torok et al. |
| 5,650,958 A | 7/1997 | Gallagher et al. |
| 5,701,222 A | 12/1997 | Gill et al. |
| 5,726,498 A | 3/1998 | Licata et al. |
| 5,741,435 A | 4/1998 | Beetz, Jr et al. |
| 5,756,366 A | 5/1998 | Berg et al. |
| 5,795,823 A | 8/1998 | Avanzino et al. |
| 5,861,328 A * | 1/1999 | Tehrani et al. .............. 438/210 |
| 5,926,394 A | 7/1999 | Nguyen et al. |
| 5,956,267 A | 9/1999 | Hurst et al. |
| 5,982,658 A | 11/1999 | Berg et al. |
| 6,048,739 A | 4/2000 | Hurst et al. |

FOREIGN PATENT DOCUMENTS

| | | |
|---|---|---|
| DE | 198 36 567 A 1 | 2/2000 |
| EP | 0 776 011 A2 | 5/1997 |
| EP | WO 98/20496 | 5/1998 |
| JP | 2000-30222 * | 1/2000 |
| WO | WO 00/19440 | 4/2000 |

OTHER PUBLICATIONS

Honeywell Brochure entitled pohm et al., "The Architecture of a High Performance Mass Store with GMR Memory Cells," *Nonvolatile Electronics*, pp. 1–3.

(List continued on next page.)

*Primary Examiner*—Howard Weiss
*Assistant Examiner*—Marcos D. Pizarro-Crespo
(74) *Attorney, Agent, or Firm*—Knobbe, Martens, Olson & Bear LLP

(57) ABSTRACT

A passivated magneto-resistive bit structure is disclosed in which surfaces subject to oxidation or corrosion are protected. In one embodiment a bit structure is encapsulated by means of an etch stop barrier material. In another embodiment an etch stop barrier material protects the top of a bit structure and dielectric spacers protect the side walls.

6 Claims, 8 Drawing Sheets

OTHER PUBLICATIONS

Pohm et al., "Experimental and Analytical Properties of 0.2 Micron Wide, Multi–Layer, GMR, Memory Elements," *IEEE Transactions on Magnetics*, vol. 32, No. 5, Sep. 1996, pp. 4645–4647.

Prinz, Gary, "Magnetoelectronics," *Science*, vol. 282, Nov. 27, 1998, pp. 1660–1663.

Wang, Zhi G. et al., "Feasibility of Ultra–Dense Spin–Tunneling Random Access Memory," *IEEE Transactions on Magnetics*, vol. 33, No. 6, Nov. 1997, pp. 4498–4512.

Razavi et al., "Design Techniques for High–Speed, High–Resolution Comparators", *IEEE Journal of Solid State Circuit*, vol. 27, No. 12, Dec. 1992.

* cited by examiner

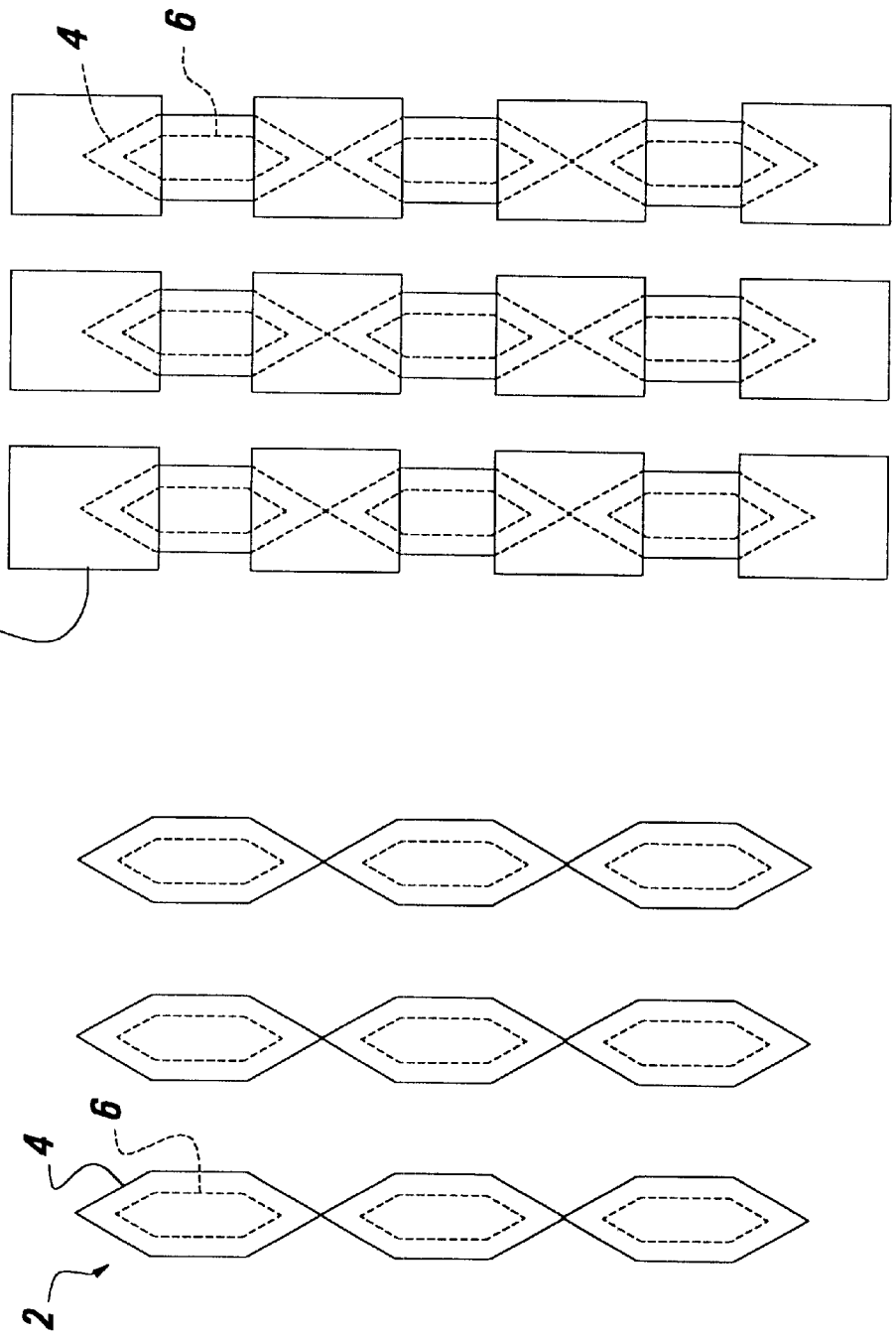

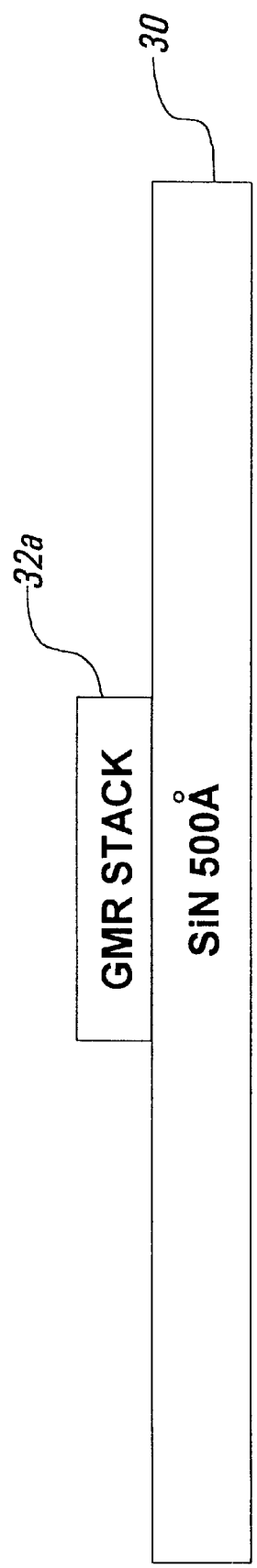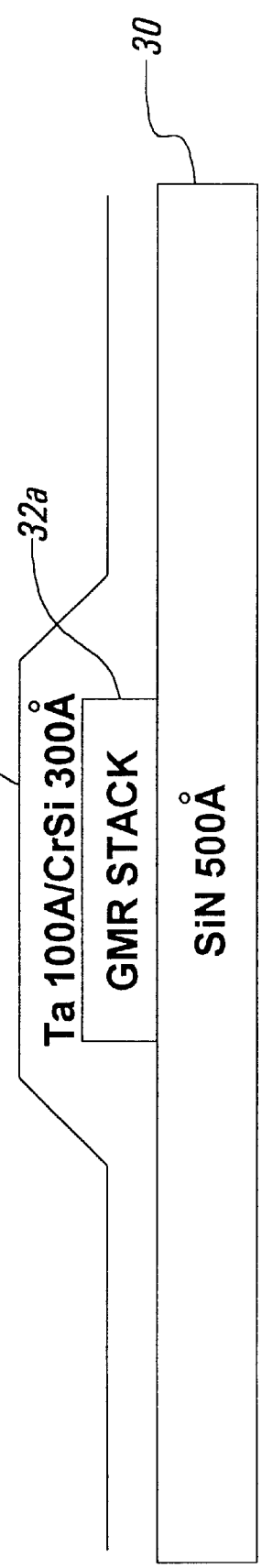

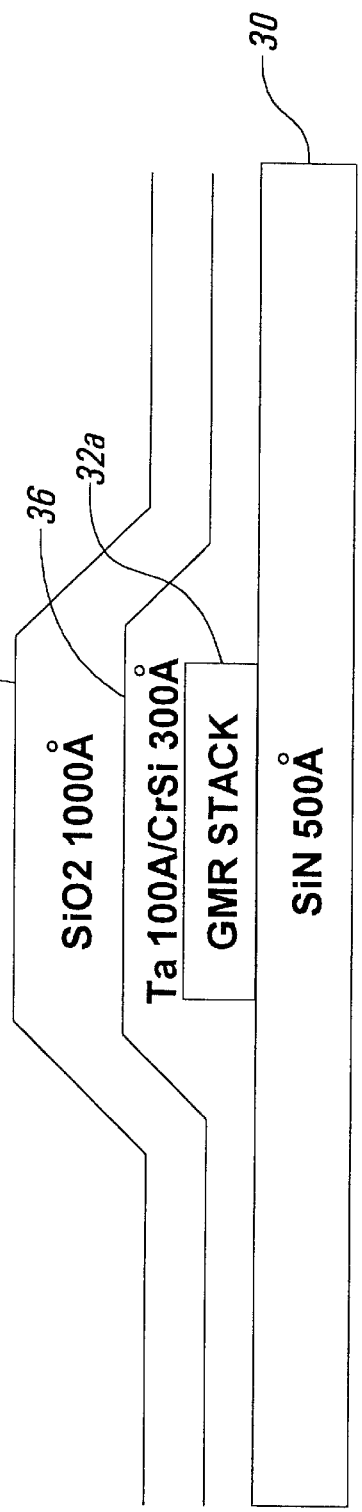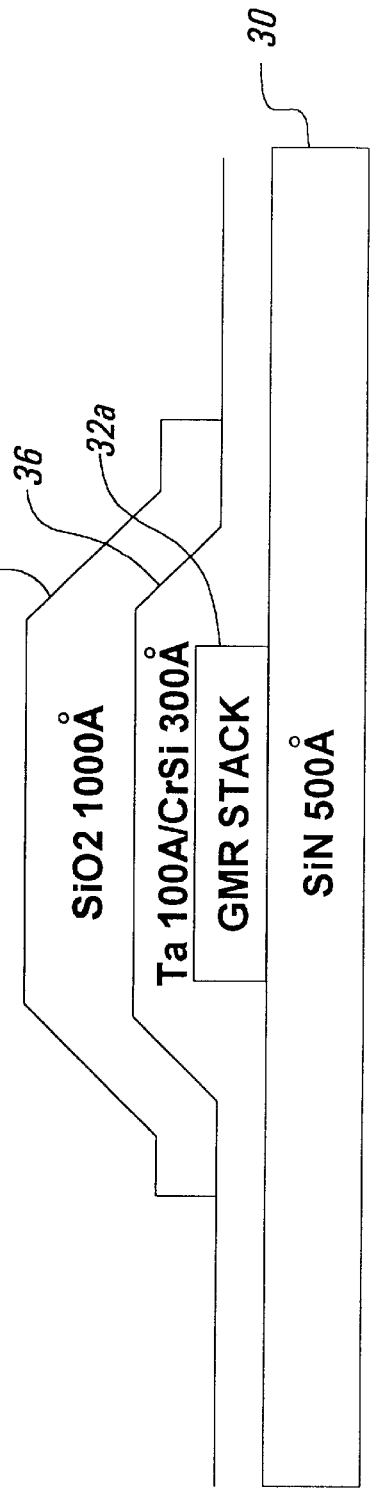

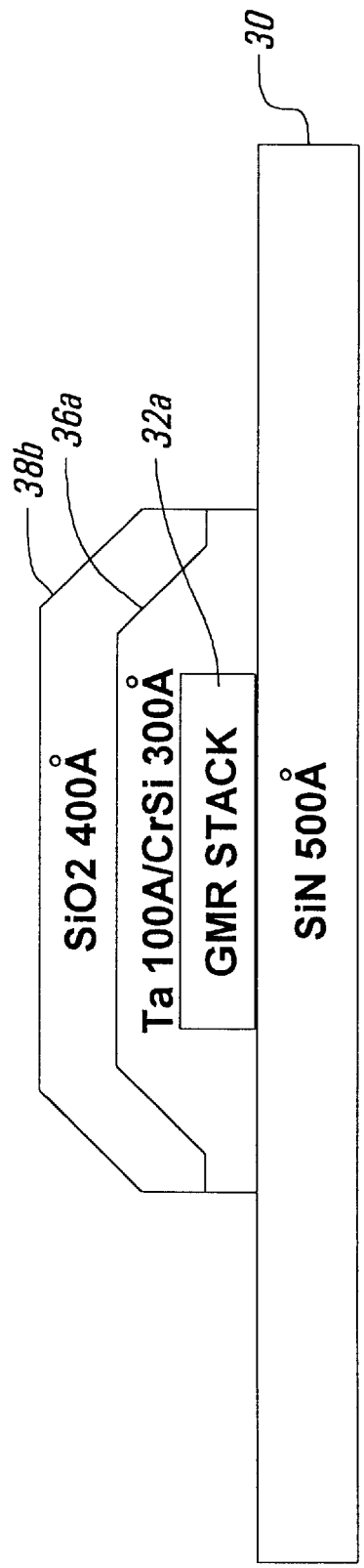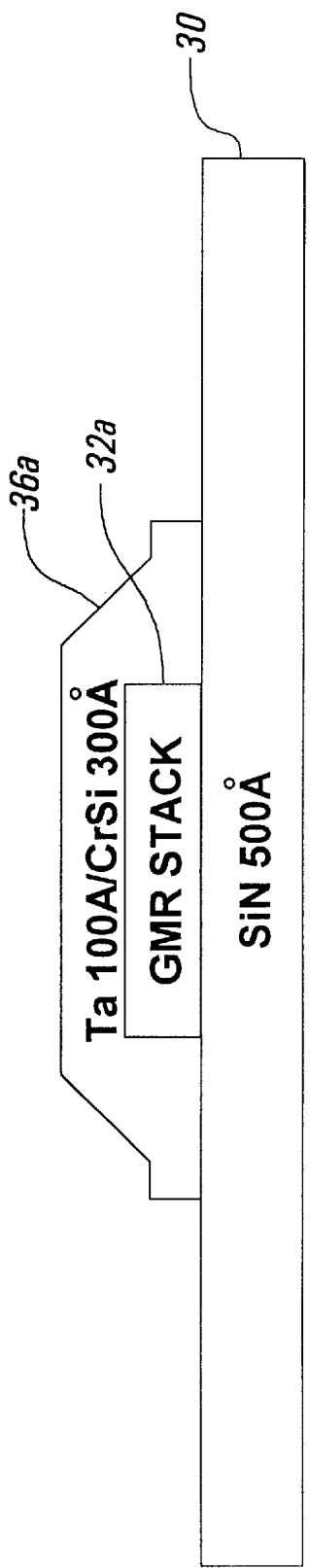

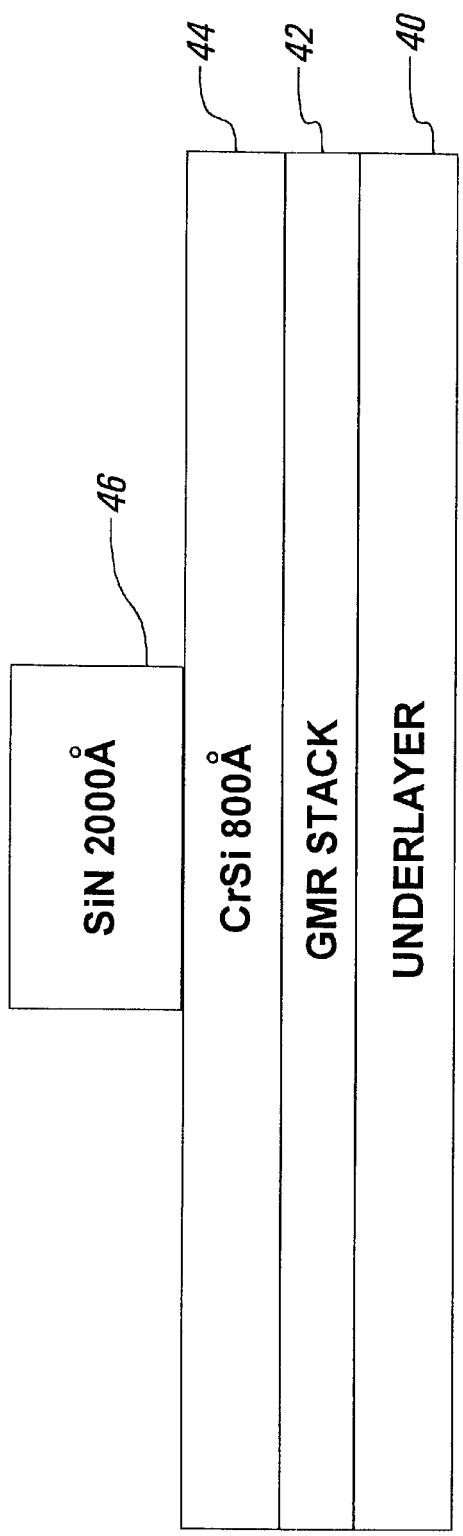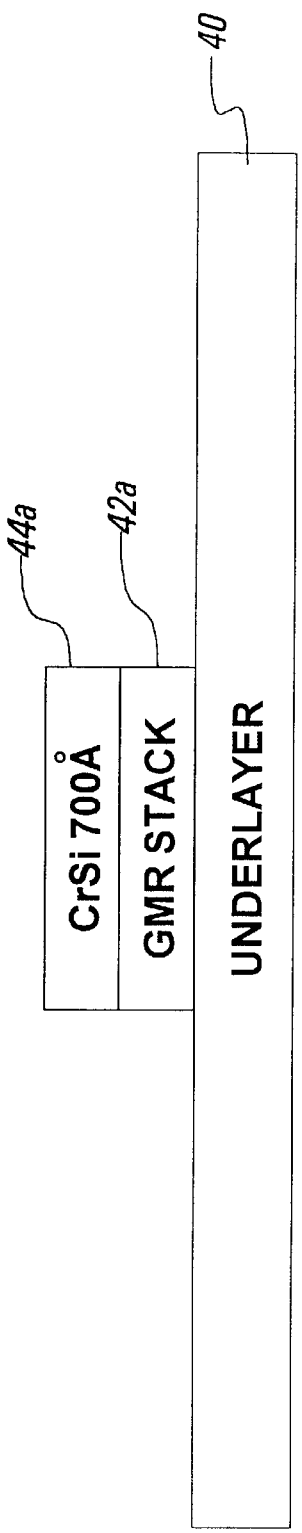

PASSIVATED MAGNETO-RESISTIVE BIT STRUCTURE AND PASSIVATION METHOD THEREFOR

BACKGROUND OF THE INVENTION

The present invention relates to magneto-resistive memories, and more particularly, to the passivation of magneto-resistive bit structures.

Typical magneto-resistive memories such as giant magneto-resistive random access memory cells (GMR MRAM's) use variations in the magnetization direction of a thin film of ferromagnetic material to represent and to store a binary state. Each thin film of ferromagnetic material in a GMR stack can be referred to as a magneto-resistive bit. During a write operation, the magnetization direction of a selected bit is set by passing an appropriate current near the bit, often using a word line, digital line, or sense line. The current produces a magnetic field that sets the magnetization direction of at least one of the layers in the ferromagnetic film in a desired direction. The magnetization direction dictates the magneto-resistance of the film. During a subsequent read operation, the magneto-resistance of the film can be read by passing a sense current through the bit structure via a sense line or the like.

Some prior art magneto-resistive bit structures are shown and described in U.S. Pat. No. 4,731,757 to Daughton et al. and U.S. Pat. No. 4,780,848 to Daughton et al., both of which are assigned to the assignee of the present invention and both of which are incorporated herein by reference. Illustrative processes for forming such magnetic bit structures are shown and described in U.S. Pat. No. 5,496,759 to Yue et al., and U.S. Pat. No. 5,569,617 to Yeh et al., both of which are assigned to the assignee of the present invention and both of which are incorporated herein by reference.

Such magneto-resistive memories are often conveniently provided on the surface of a monolithic integrated circuit to provide easy electrical interconnection between the bit structures and the memory operating circuitry on the monolithic integrated circuit. To provide a sense current through the bit structure, for example, the ends of the bit structure are typically connected to adjacent bit structures through a metal interconnect layer. The string of bit structures then forms a sense line, which is often controlled by operating circuitry located elsewhere on the monolithic integrated circuit.

A problem which arises as a result of the use of magneto-resistive memories is that conventional integrated circuit processes often cannot be used to form the contact holes or vias that are used to provide connections to the bit structure. For example, in a conventional integrated circuit process, vias are often formed by means of an etching process. First, a patterned photoresist layer, which defines the location and size of the vias, is provided over the integrated circuit. With the photoresist layer in place, vias are etched down to the bit structure. Once the vias are etched, a photoresist removal step typically is used to remove the photoresist layer.

In a typical integrated circuit back-end process the GMR bit ends are susceptible to damage by the corrosive chemicals used in the etching process. Furthermore, GMR bit ends may be exposed to a plasma environment with oxygen during removal of the photoresist in the oxygen asher process and are left unpassivated thereafter. Oxidation of the side walls of the bit ends can lead to significant degradation and adversely affect performance of the GMR MRAM'S. In order to avoid potential disastrous consequences, oxygen plasma photoresist removal is not generally utilized at the post Permalloy via etch or subsequent M3 etch stages. Instead, various solvent photoresist strip processes are utilized to remove the photoresist layers. Where a solvent or "wet" photoresist strip is used, it is necessary to choose the solvent with extreme care and to limit solvent use to mild solvents. In general, wet photoresist strips, although reducing the risk of oxidation, are prone to other defects and are not very production-worthy.

What would be desirable, therefore, is a magneto-resistive bit structure which is not subject to oxidation or corrosion by processing steps when forming vias. More specifically, it would be desirable to form a magneto-resistive bit structure without directly exposing the side walls of the bit ends to the potentially adverse effects of processes involved in via formation. This may allow more efficient and reliable back-end processing, which, in turn may reduce the defect density and increase the overall performance of devices incorporating magneto-resistive memories.

SUMMARY OF THE INVENTION

The present invention overcomes many of the disadvantages of the prior art by providing a magneto-resistive bit structure wherein the bits are protected from the potentially adverse effects of process steps that could damage the unprotected bit structure.

In one embodiment of the invention, magneto-resistive bits are encapsulated by means of an etch stop barrier material, such as CrSi, which is deposited as a barrier to cover both the top surface and side walls of a GMR stack. Encapsulation of GMR cells is highly desirable because exposed surfaces are susceptible to process damage resulting in degradation in the switching characteristics of the cells. The etch stop barrier material, preferably CrSi, provides a good barrier to oxygen and corrosive chemicals and thereby improves the robustness of GMR cells. It is selected to have a bulk resistivity which is low enough to allow sense line contact and high enough so that shunting will be negligible.

In another embodiment of the present invention, an etch stop barrier layer, for example, a layer of CrSi protects the top of the GMR stack while the side walls are protected by means of a dielectric extending along the edges of the GMR stack. For example, a SiN spacer can be formed by means of a controlled Permalloy via etch.

Metals deposited upon the passivated bit structure contact the bit ends only from the top through the etch stop layer, while the side walls of the bit ends are insulated from the metal by the dielectric spacer.

Passivation of magneto-resistive bit structures by the methods of this invention significantly improves the repeatability of GMR cells and makes the GMR back-end process more production-worthy.

BRIEF DESCRIPTION OF THE DRAWINGS

Other objects of the present invention and many of the attendant advantages thereof will be readily appreciated as the same becomes better understood by reference to the following detailed description when considered in connection with the accompanying drawings, in which like reference numerals designate like parts throughout the figures thereof and wherein:

FIG. 1 is a plan view, partly in phantom, of one illustrative embodiment of the passivated magneto-resistive bit structures of the present invention;

FIG. 2 is a plan view showing sense line metal contacts on top of the passivated magneto-resistive bit structure shown in FIG. 1;

FIGS. 3 to 10 are cross-sectional views showing certain of the steps of a process for forming a passivated magneto-resistive bit structure according to one embodiment of the present invention; and FIGS. 11 to 15 are cross-sectional views showing certain of the steps of a process for forming the passivated magneto-resistive bit structure according to another embodiment of the present invention.

DETAILED DESCRIPTION OF THE PREFERRED EMBODIMENTS

FIG. 1 is a plan view of an illustrative embodiment of the present invention. An array of passivated magneto-resistive bit structures are shown generally at 2. A passivating material 4 is deposited on top of magneto-resistive bit 6, shown in phantom. FIG. 2 is similar to FIG. 1 with sense-line metal contacts 8 deposited on top of passivating material 4, which is at least partially conductive.

A process for forming a passivated magneto-resistive bit structure according to a preferred embodiment of the present invention will now be illustrated by reference to FIGS. 3 to 10.

Figure 3:
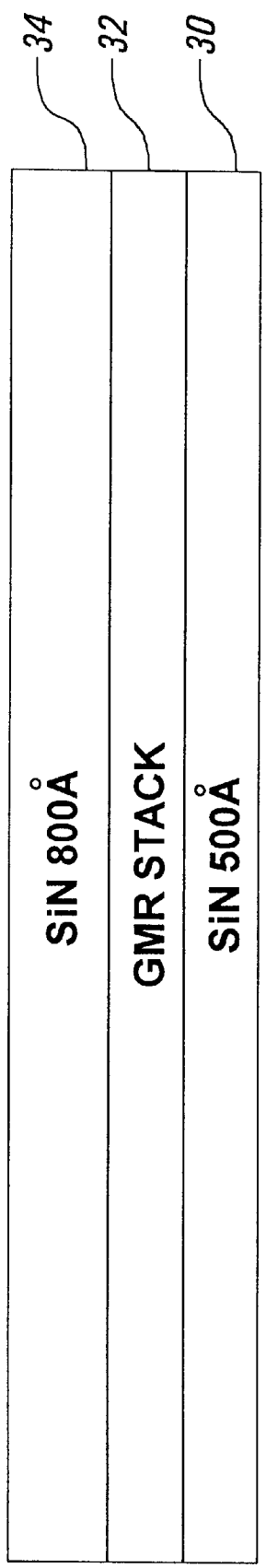

Referring to FIG. 3, a GMR stack 32 is shown deposited upon a SiN substrate 30, which may be a 500 Å SiN layer. Alternatively, substrate 30 may be a monolithic integrated circuit or an integrated circuit separated from GMR stack layer 32 by a dielectric layer. A SiN layer 34 is deposited upon GMR stack 32. SiN layer 34 may be an 800 Å SiN layer.

Figure 4:
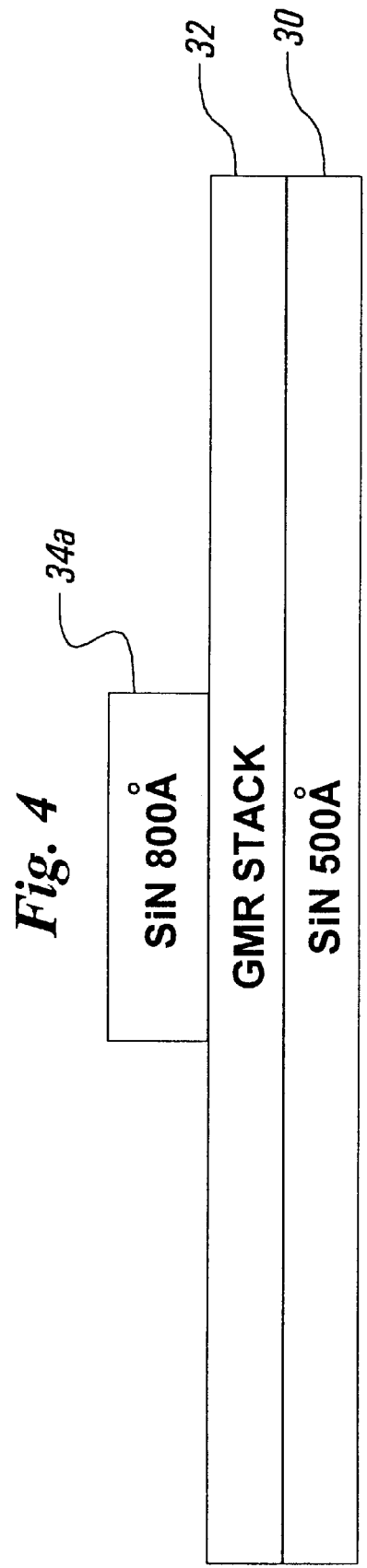

In the next step of the process, an ion mill mask is built upon GMR stack 32 using the SiN layer 34. FIG. 4 shows ion mill mask 34a formed from SiN layer 34. Part of SiN layer 34 is etched away by reactive ion etching.

In the next step of the process, ion milling is used to pattern GMR stack 32. FIG. 5 shows a patterned GMR stack 32a resulting from this step, in which ion mill mask 34a is removed as well as a part of GMR stack layer 32.

The next step in the overall process is the deposition of a barrier layer, which, after patterning, serves as the encapsulant in this embodiment of the present invention. As a barrier layer any etch stop material can be used which has a bulk resistivity low enough to allow sense line contact and high enough so that shunting will be negligible. CrSi is preferred. If desired, a thin Ta or TaN diffusion barrier can be deposited between the above-described barrier layer and the GMR stack to prevent intermixing. FIG. 6 shows a barrier layer 36, made up of a 300 Å CrSi layer on a 100 Å Ta layer, deposited upon patterned GMR stack 32a and SiN substrate 30.

Following the Ta/CrSi barrier layer deposition a dielectric layer is deposited upon barrier layer 36. Any dielectric can be used. $SiO_2$ or SiN is preferred. FIG. 7 shows a 1000 Å $SiO_2$ layer 38 deposited upon Ta/CrSi barrier layer 36.

Following deposition of $SiO_2$ layer 38, in the next step, shown in FIG. 8, a part of dielectric layer 38 is removed by reactive ion etch to expose the unwanted portions of Ta/CrSi barrier layer 36, resulting in patterned dielectric layer 38a.

With the unwanted portions of the Ta/CrSi barrier layer 36 exposed, ion milling is utilized to remove the unwanted portions of the Ta/CrSi barrier layer 36. FIG. 9 shows patterned Ta/CrSi barrier layer 36a resulting from this step as well as a residual $SiO_2$ layer 38b. Patterned $SiO_2$ layer 38a in FIG. 8 has been reduced in thickness as a result of the ion milling step to result in residual $SiO_2$ layer 38b having a thickness of 400 Å.

Finally, and as shown in FIG. 10, residual $SiO_2$ layer 38b from FIG. 9 is removed by reactive ion etch, resulting in GMR stack 32a being fully encapsulated by Ta/CrSi barrier 36a. Thus, a passivated magneto-resistive bit structure is provided by encapsulation of the GMR stack by means of a Ta/CrSi barrier. Both the tops and the side walls of the GMR bits are protected by passivation in the manner described above. The side walls of the GMR bits are not exposed either during Permalloy via etch or thereafter. Therefore, oxygen asher photoresist removal and conventional wet chemical strips can be used without damage to the passivated GMR bits.

An alternative embodiment of the present invention will now be illustrated by reference to FIGS. 11 to 15. Referring to FIG. 11, an underlayer 40, which may be a monolithic integrated circuit, serves as a substrate for a GMR stack 42. Underlayer 40 preferably includes a dielectric layer separating the GMR stack from an integrated circuit. The dielectric layer may be, for example, a 500 Å seed SiN layer, not shown. A CrSi barrier layer 44 is deposited on top of GMR stack 42. A SiN ion mill mask 46 is fabricated in a known manner on top of CrSi layer 44. For example, a relatively thick SiN layer can be deposited upon CrSi layer 44 and patterned using a photoresist and reactive ion etch. Layer 44 may, for example, be an 800 Å thick CrSi layer. CrSi is preferred because, in addition to being a good oxygen barrier and etch stop, CrSi has a bulk resistivity low enough to allow sense line contact and high enough to minimize shunting. Ion mill mask 46 may be a 2000 Å SiN layer. Other suitable dielectric materials such as $SiO_2$ can be used, if desired. SiN is preferred because, in addition to being an excellent dielectric, it provides an efficient barrier against oxidation and protects GMR bits from other damaging materials as well.

The next step in the process is illustrated in FIG. 12, wherein the results of ion milling are shown. It can be seen that portions of CrSi layer 44 and portions of GMR stack 42 have been removed, resulting in patterned GMR stack 42a and patterned CrSi barrier layer 44a. The ion mill mask is then separately removed. As shown, CrSi layer 44a has been reduced from a thickness of 800 Å to a remaining thickness of 700 Å.

Figure 13:
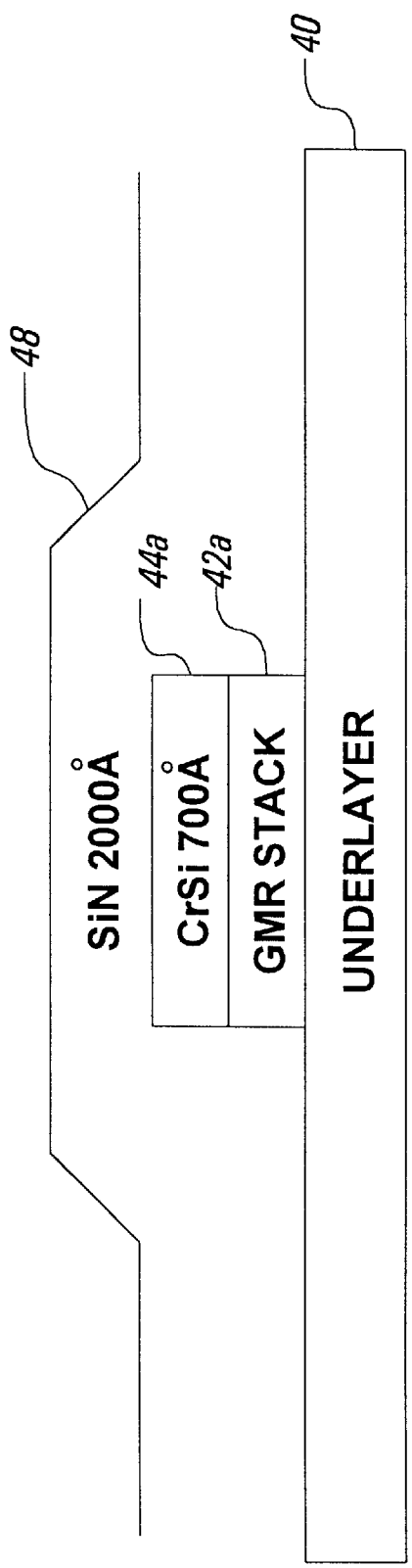

The next step in the process is deposition of a layer of a dielectric material, such as a 2000 Å layer of SiN or $SiO_2$, followed by planarization, such as by using high-angle ion milling or chemical mechanical polishing (CMP). FIG. 13 shows a planarized layer of SiN 48 deposited upon the structure of FIG. 12.

Figure 14:
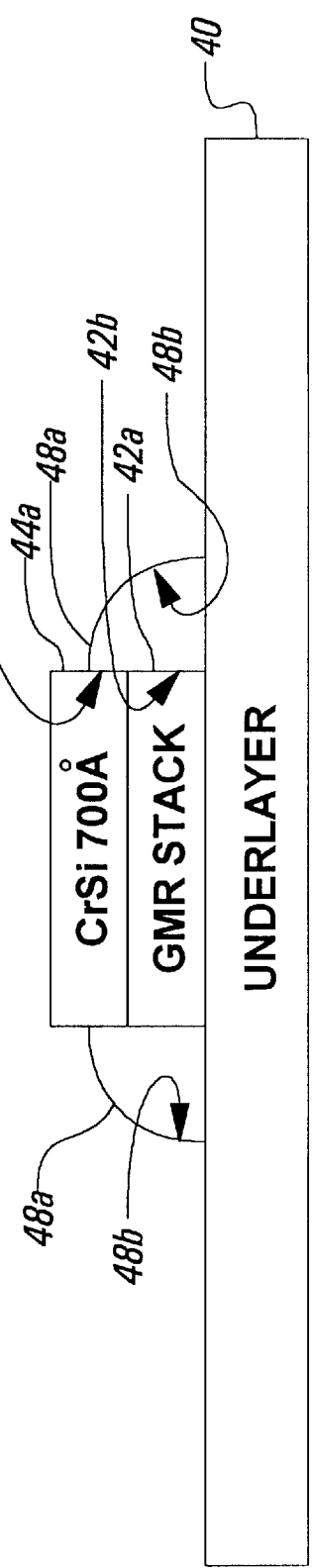

The next process step is a controlled Permalloy via etch, the results of which are illustrated in FIG. 14. In this step most of the SiN layer 48 is removed, leaving naturally-created SiN passivation spacers 48a along the side walls 42b of patterned GMR stack 42a and providing a passivated magneto-resistive bit structure. Spacers 48a are shown abutting the side walls 42b of patterned GMR stack 42a and the side walls 44b of patterned CrSi layer 44a. Spacers 48a are shown having side walls 48b, which are spaced out laterally from the side walls 42b of GMR stack 42a and side walls 44b of patterned CrSi layer 44a.

Figure 15:
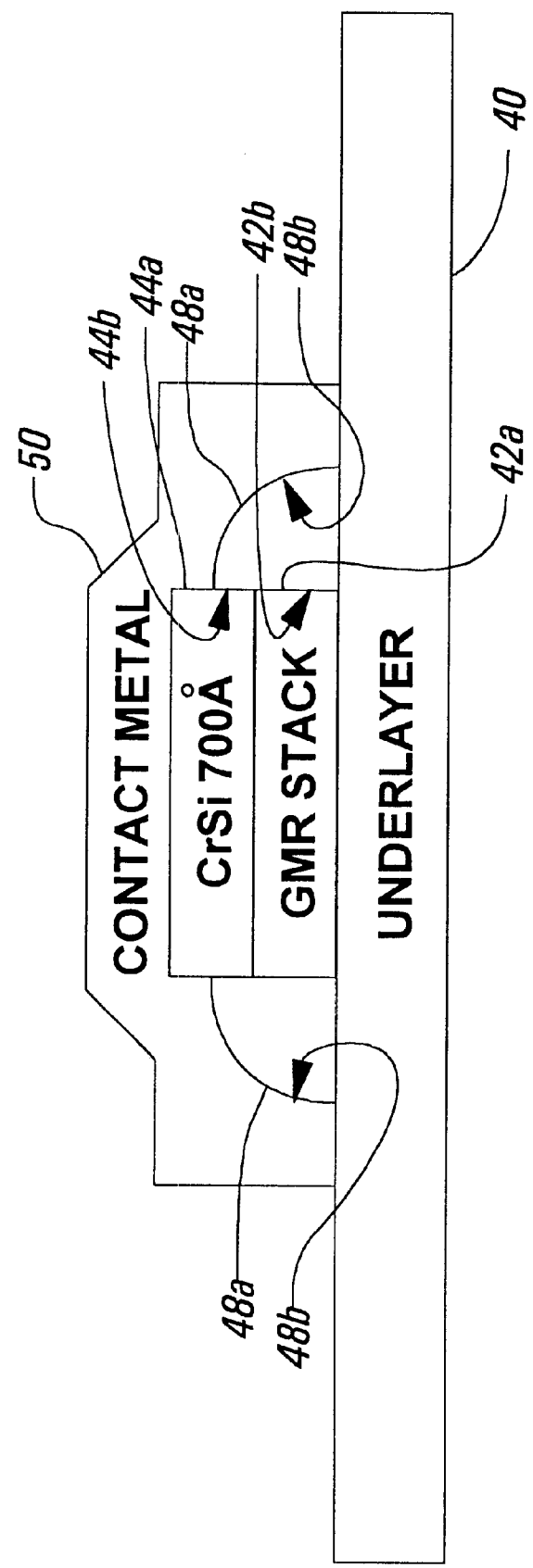

In FIG. 15 a contact metal 50 is deposited over the passivated magneto-resistive bit structure of FIG. 14. Contact metal 50 does not contact GMR stack 42a directly at any point, since the side walls 42b of GMR stack 42a are protected by spacers 48a and the top of GMR stack 42a is protected by CrSi layer 44a. Indirect contact between GMR stack 42a and contact metal 50 is possible only at the top of GMR stack 42a through CrSi layer 44a, which conducts electric current between contact metal 50 and GMR stack 42a. The SiN spacers provide an excellent barrier against oxidation and contact by corrosive chemicals.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention.

What is claimed:

1. A passivated magneto-resistive bit structure characterized by:

a substrate;

a magneto-resistive bit provided upon said substrate, the magneto-resistive bit having a top surface and side walls;

an etch stop barrier layer provided upon at least part of the top surface of said bit, said etch stop barrier layer having a top surface and side walls;

a dielectric side wall spacer provided along at least part of the side walls of said bit, the dielectric spacer extending laterally away from said magneto-resistive bit; and a contact layer provided over at least part of said etch stop barrier layer and over at least part of the dielectric side wall spacer for providing an electrical connection to said magneto-resistive bit via the etch stop barrier layer.

2. A passivated magneto-resistive bit structure according to claim 1, wherein said dielectric side wall spacer is provided along at least part of the side walls of said bit and along at least part of the side walls of said etch stop barrier layer.

3. A passivated magneto-resistive bit structure according to claim 2, wherein said dielectric side wall spacer extends from the bottom of each of the side walls of said bit to a point below the top of each of the side walls of said etch stop barrier layer.

4. A passivated magneto-resistive bit structure according to claim 1, wherein said dielectric side wall spacer comprises SiN.

5. A passivated magneto-resistive bit structure according to claim 1, wherein said etch stop barrier layer is at least partially conductive.

6. A passivated magneto-resistive bit structure according to claim 1, wherein said etch stop barrier layer comprises CrSi.

* * * * *

UNITED STATES PATENT AND TRADEMARK OFFICE
CERTIFICATE OF CORRECTION

PATENT NO.    : 6,392,922 B1
DATED         : May 21, 2002
INVENTOR(S)   : Harry Liu et al.

It is certified that error appears in the above-identified patent and that said Letters Patent is hereby corrected as shown below:

<u>Column 1,</u>
Line 4, please add the following paragraph:
-- This invention was made with Government support under Contract Number MDA972-98-C-0021 awarded by DARPA. The Government has certain rights in this invention. --

Signed and Sealed this

Eighth Day of July, 2003

JAMES E. ROGAN
*Director of the United States Patent and Trademark Office*